US006762735B2

(12) United States Patent
Koyama

(10) Patent No.: US 6,762,735 B2
(45) Date of Patent: Jul. 13, 2004

(54) ELECTRO LUMINESCENCE DISPLAY DEVICE AND METHOD OF TESTING THE SAME

(75) Inventor: Jun Koyama, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 195 days.

(21) Appl. No.: 09/852,745

(22) Filed: May 11, 2001

(65) Prior Publication Data

US 2001/0040565 A1 Nov. 15, 2001

(30) Foreign Application Priority Data

May 12, 2000 (JP) ........................................ 2000-140751

(51) Int. Cl.[7] ................................................. G09G 3/30
(52) U.S. Cl. ............................ 345/76; 345/904; 345/80
(58) Field of Search ............................. 345/45, 76, 80, 345/204, 904

(56) References Cited

U.S. PATENT DOCUMENTS

| | | | | |
|---|---|---|---|---|
| 5,179,345 A | * | 1/1993 | Jenkins et al. | 324/678 |
| 5,184,082 A | * | 2/1993 | Nelson | 324/537 |
| 5,539,326 A | * | 7/1996 | Takahasi et al. | 324/770 |
| 5,550,484 A | * | 8/1996 | Mitsumori et al. | 324/769 |
| 5,990,629 A | * | 11/1999 | Yamada et al. | 315/169.3 |
| 6,111,424 A | * | 8/2000 | Bosacchi | 324/770 |
| 6,265,889 B1 | * | 7/2001 | Tomita et al. | 324/765 |
| 6,501,227 B1 | * | 12/2002 | Koyama | 315/169.3 |
| 6,528,950 B2 | * | 3/2003 | Kimura | 315/169.3 |

* cited by examiner

Primary Examiner—Amare Mengistu
Assistant Examiner—Tom Sheng
(74) Attorney, Agent, or Firm—Fish & Richardson P.C.

(57) ABSTRACT

To increase the proportion of the perfects to the whole lot of final products and to reduce the cost for active matrix EL display devices by checking the operation of a TFT substrate before depositing an EL material. A capacitor for testing is connected to a drain terminal of a driving TFT in a pixel portion to observe charging and discharging of the capacitor. Whether the driving TFT is normal or not is judged by the observation, so that the rejects can be removed before the manufacturing process is completed.

20 Claims, 13 Drawing Sheets

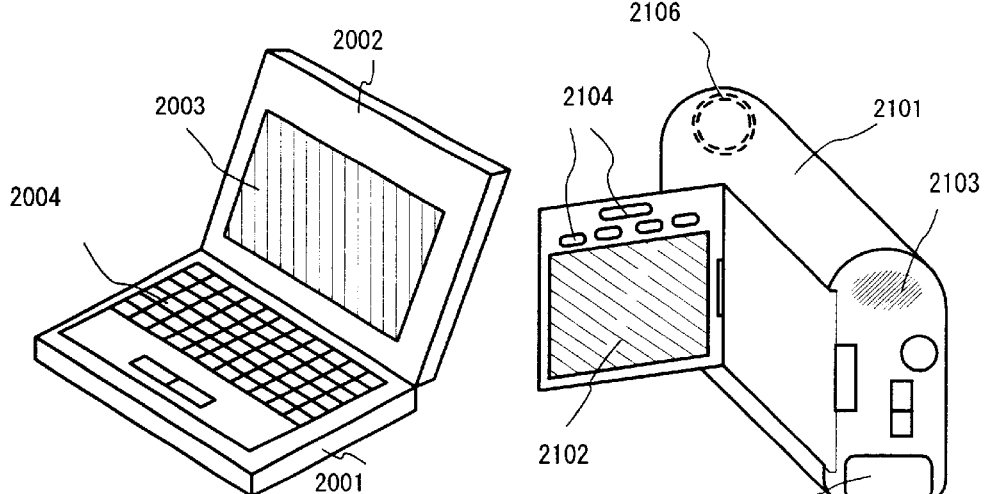
FIG. 9A
FIG. 9B
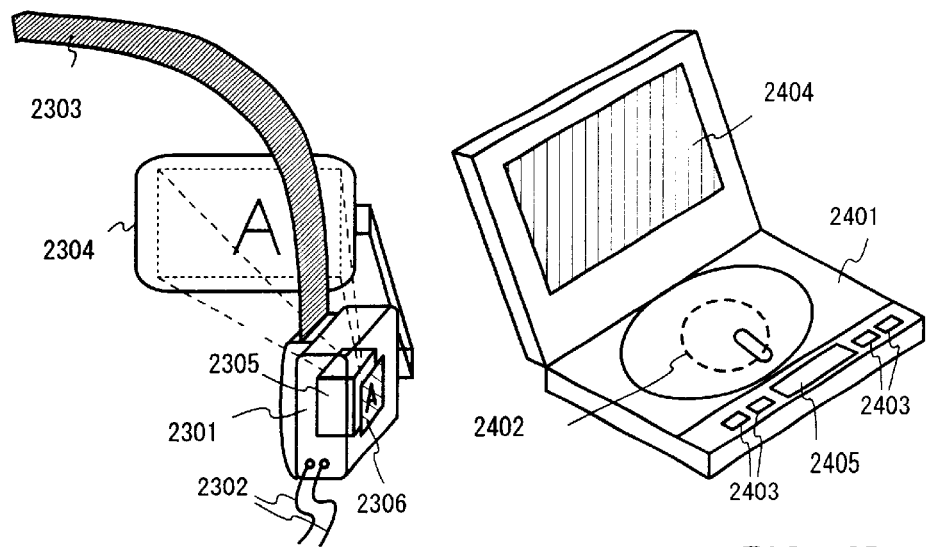
FIG. 9C
FIG. 9D
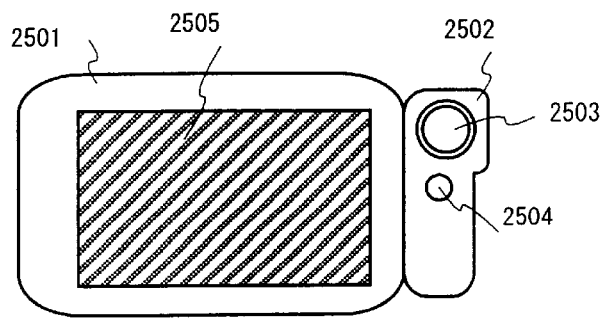
FIG. 9E

ELECTRO LUMINESCENCE DISPLAY DEVICE AND METHOD OF TESTING THE SAME

BACKGROUND OF THE INVENTION

1. Field of the Invention

The present invention relates to an electronic display (electro optical device) formed by fabricating an EL (electro luminescence) on a substrate. In particular, the present invention relates to a display device using a semiconductor element (an element which uses a semiconductor thin film). Further, the present invention relates to an electronic device using an EL display in a display portion and the method of detecting the EL display.

The EL element herein refers to both an element that utilizes light emission from a singlet exciton (fluorescence) and an element that utilizes light emission from a triplet exciton (phosphorescence).

2. Description of the Related Art

Recently, a technique for forming a thin film transistor (hereinafter, referred to as TFT) on a substrate has been remarkably developed, and a development of its application to an active matrix display device has been continuously made. In particular, TFTs using a polysilicon film can operate at high speed, because such TFTs have a higher field effect mobility than TFTs using a conventional amorphous silicon film. Therefore, the control of pixels, which has been conventionally conducted by a driver circuit provided outside a substrate, can be performed by a driver circuit provided on the same substrate on which the pixels are provided.

Such an active matrix display device includes various circuits and elements formed on the same substrate. With this structure, the active matrix display device provides various advantages such as reduced manufacturing cost, reduced size of a display device, an increased yield, and a reduced throughput.

Furthermore, an active matrix EL display device including an EL element as a self-luminescent element has been actively studied. The EL display device is also called Organic EL Display (OELD) or Organic Light Emitting Diode (OLED).

In contrast with the liquid crystal display device, the EL display device is selfluminescent. The EL element has such a structure that an EL layer is sandwiched between a pair of electrodes (anode and cathode). However, the EL layer has normally a lamination structure. As a typical example of the lamination structures, a lamination structure "hole transport layer/light emitting layer/electron transport layer" proposed by Tang et al. of Eastman Kodak Company is cited. This structure has an extremely high light emitting efficiency. For this advantage, most light emitting devices, which are currently under study and development, employ this structure.

Furthermore, the light emitting device may have such a lamination structure that a hole injection layer, a hole transport layer, a light emitting layer and an electron transport layer are deposited on an anode or a hole injection layer, a hole transport layer, a light emitting layer, an electron transport layer, and an electron injection layer are deposited on an anode in this order. Moreover, the light emitting layer may be doped with a fluorescent pigment or the like.

All layers formed between a cathode and an anode are referred to generically as EL layers within this specification. The above stated hole injecting layer, hole transporting layer, light emitting layer, electron transporting layer, electron injecting layer, and the like are therefore all contained within the EL layer.

A predetermined voltage is then applied to the EL layer having the above structure by a pair of electrodes, thus recombination of a carrier thus occurs in the light emitting layer, and light is emitted. Note that the emission of light by the EL element is referred to as driving the EL element throughout this specification. Further, an EL element formed by an anode, an EL layer, and a cathode is referred to as an EL element throughout this specification.

As a method of driving an EL display device, an analog driving method (analog drive) can be given. The analog drive of an EL display device is described with reference to FIGS. 10 and 11.

FIG. 10 shows a structure of a pixel portion of an EL display device that is driven in an analog manner. Gate signal lines (G1 through Gy) to which a gate select signal from a gate signal line driver circuit is input are connected to a gate electrode of a switching TFT 1801 included in each pixel. One of a source region and a drain region of the switching TFT 1801 included in each pixel is connected to source signal lines (also referred to as data signal lines) S1 to Sx to which an analog video signal is input, whereas the other is connected to a gate electrode of an EL driver TFT 1804 included in each pixel and a capacitor 1808 included in each pixel.

A source region and a drain region of the driver TFT 1804 included in each pixel are connected to power source supply lines V1 through Vx and to an EL element 1806, respectively. An electric potential of the power source supply lines V1 through Vx is referred to as an power source electric potential. The power source supply lines V1 through Vx are connected to the capacitors 1808 included in the respective pixels.

The EL element 1806 includes an anode, a cathode and an EL layer sandwiched between the anode and the cathode. If the anode of the EL element 1806 is connected to the source or the drain region of the driver TFT 1804, the anode and the cathode of the EL element 1806 become a pixel electrode and an opposing electrode, respectively. On the other hand, if the cathode of the EL element 1806 is connected to the source or the drain region of the driver TFT 1804, the anode and the cathode of the EL element 1806 become an opposing electrode and a pixel electrode, respectively.

Note that the electric potential of the opposing electrode is referred to as an opposing electric potential in this specification. Note also that an power source for imparting the opposing electric potential to the opposing electrode is referred to as an opposing electric power supply. The electric potential difference between the electric potential of the pixel electrode and the electric potential of the opposing electrode is an EL driver voltage, and the EL driver voltage is applied to the EL layer.

FIG. 11 shows a timing chart in the case where the EL display device shown in FIG. 10 is driven in an analog manner. The period from the selection of one gate signal line until the selection of a next gate signal line is called one line period (L). The period from the display of one image to another image corresponds to one frame period (F). In the case of the EL display device shown in FIG. 10, since there are y gate signal lines, y line periods (L1 to Ly) are provided within one frame period.

With the enhancement in resolution, the number of line periods within one frame period increases. As a result, the driver circuit must be driven at a high frequency.

An power source electric potential at the power source supply lines (V1 through Vx) is held constant, and an opposing electric potential at the opposing electrodes is also held constant. The opposing electric potential has a potential difference with the power source electric potential to such a degree that a EL element 1806 emits light.

The gate signal line G1 is selected in the first line period L1 by a gate signal input to the gate signal line G1 from the gate signal line driver circuit. Then an analog video signal is then input in order to the source signal lines S1 to Sx. All of the switching TFTs 1801 connected to the gate signal line G1 are in an ON state, and therefore the analog video signal input to the source signal lines S1 to Sx is input to gate electrodes of the driver TFTs 1804 through the switching TFTs 1801.

The description here takes as an example a timing chart of the case where the switching TFT 1801 and the driving TFT 1804 are both n-channel TFTs. The switching TFT and the driving TFT may instead be p-channel TFTs, or one of them may be an n-channel TFT while the other is a p-channel TFT.

In this specification, the TFT being turned ON means that the gate voltage of the TFT is changed such that the source-drain thereof is brought into conductive state.

The amount of a current flowing through a channel formation region of the driver TFT 1804 is controlled by a level of an electric potential (voltage) of a signal input to the gate electrode of the driver TFT 1804. Accordingly, the electric potential applied to the pixel electrode of the EL element 1806 is determined by the level of the electric potential of the analog video signals input to the gate electrode of the driver TFT 1804. Then, the EL element 1806 is controlled by the electric potential of the analog video signals to emit light.

When the above-described operation is repeated to complete the input of analog video signals to the source signal lines (S1 through Sx), the first line period (L1) terminates. One line period may alternatively be constituted by the period until the completion of input of the analog video signals to the source signal lines (S1 through Sx) and a horizontal blanking period. Then, a second line period (L2) starts where a gate signal line G2 is selected by a gate signal. And, as in the first line period (L1), analog video signals are sequentially input to the source signal lines (S1 through Sx) during the second line period.

When all gate signal lines (G1 through Gy) are selected in this manner, all lines periods (L1 through Ly) are completed. The completion of all the line periods (L1 through Ly) corresponds to the completion of one frame period. All pixels perform display during one frame period to form an image. One frame period may be alternatively constituted by all line periods (L1 through Ly) and a vertical blanking period.

The amount of light emitted by the EL element 1806 is thus controlled in accordance with the analog video signal, and gray scale display is performed by controlling the amount of light emitted. This method is namely a driving method referred to as an analog driving method, gray scale display is performed by changing the electric potential of the analog video signal input to the source signal lines.

In the conventional EL display device, the drain region of the driving TFT 1804 in the pixel portion is connected only to the EL element 1806 as shown in FIG. 10.

TFTs are formed on a substrate having an insulating surface in order to constitute pixel TFTs (each formed of a switching TFT and a driving TFT) and driver circuits (including a source signal line driving circuit and a gate signal line driving circuit). An EL material is then deposited and the driving TFT is electrically connected to an EL element. The manufacturing steps prior to the step of depositing the EL material are called herein TFT steps.

Before the EL material is deposited, the drain region of the driving TFT in the conventional display device is thus in an open state from the design of the circuit. Whether a certain pixel TFT operates normally or not cannot be judged until the EL material is deposited to complete the display device and lighting test is performed on the completed device. Therefore, it is not until after the manufacturing process reaches the final step that a display device incapable of normal display because of a defective pixel TFT can be found out. This is utterly a waste.

As described above, the conventional EL display device does not allow its pixel TFTs to be checked for their operation during the steps prior to deposition of the EL material, thereby incurring a waste in manufacturing cost.

SUMMARY OF THE INVENTION

The present invention has been made in view of the above problem, and an object of the present invention is therefore to provide an active matrix EL display device that allows its pixel TFTs to be checked for their operation before depositing an EL material.

In order to attain the object above, the inventors of the present invention have thought of cutting waste along the manufacture line by testing driving TFTs and switching TFTs before depositing an EL material and removing substrates having TFTs that are found to be defective through the test (hereinafter referred to as the rejects) from the subsequent step of depositing the EL material.

The structure of the EL display device of the present invention is as described below.

In a first aspect of the present invention, an EL display device is provided which comprises a plurality of source signal lines, a plurality of gate signal lines, a plurality of power supply lines, a plurality of switching thin film transistors and a plurality of driving thin film transistors which are all formed on an insulating substrate, comprising a testing capacitor which is set such that one end thereof is connected to a drain region of each of the driving thin film transistors and the other end thereof is connected to one of the gate signal lines, and characterized in that the power supply lines are led out of the insulating substrate through switches.

In a second aspect of the present invention, an EL display device is provided characterized in that, the switches are provided for the plural power supply lines on one on one basis, and a driver circuit for driving the switches successively is placed on the insulating substrate.

In a third aspect of the present invention, an EL display device is provided characterized in that the driver circuit for driving the switches successively has some components shared with a source signal line driving circuit.

In a fourth aspect of the present invention, a method of testing an EL display device is provided, which comprises a plurality of source signal lines, a plurality of gate signal lines, a plurality of power supply lines, a plurality of switching thin film transistors and a plurality of driving thin film transistors which are all formed on an insulating substrate, the driving thin film transistors each having a drain region that is connected to a testing capacitor, the method comprising the steps of: operating the driving thin film transistors to charge the testing capacitor until it reaches and keeps a certain level of electric potential; turning the driving thin film transistors OFF and then setting the electric potential of the power supply lines to a level different from the electric potential of the testing capacitor; and leading the electric charges charged in the testing capacitor out for each pixel through its associated power supply line, so that a change in electric potential can be detected.

In a fifth aspect of the present invention, a computer, a video camera, a head mount display, an image reproducing device, a portable information terminal characterized by using an EL display device.

BRIEF DESCRIPTION OF THE DRAWINGS

In the accompanying drawings:

FIGS. 9A to 9E show electronic equipments employing a display device of the present invention;

DETAILED DESCRIPTION OF THE PREFERRED EMBODIMENTS

The structure of an EL display device of the present invention and a method of testing the same will be described below.

Figure 1:
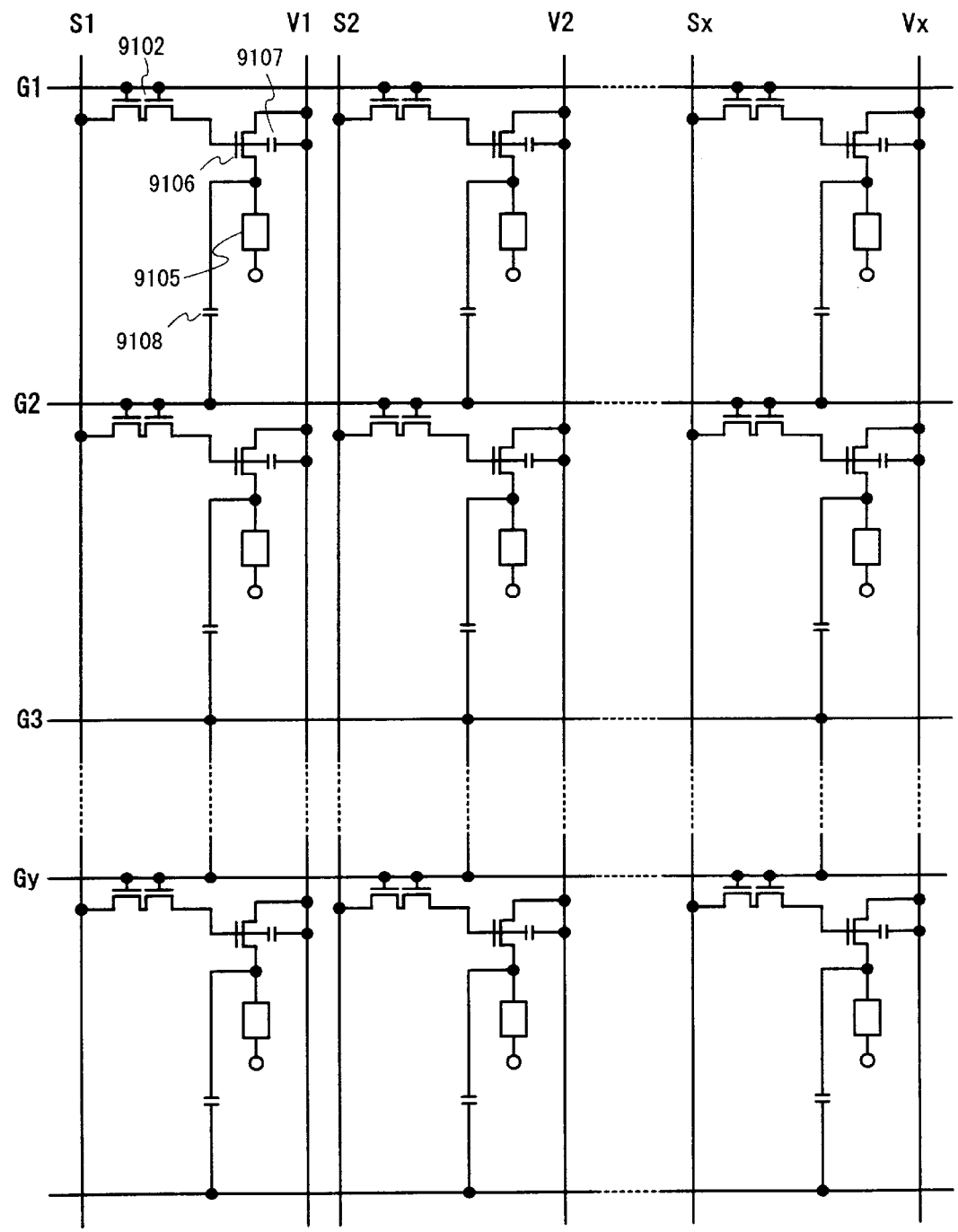
FIG. 1 is a diagram showing the circuit structure of a pixel portion of a display device according to the present invention.

FIG. 1 shows Embodiment Mode 1 of the present invention. Shown in FIG. 1 is a structural diagram of a pixel portion in the display device of the present invention.

Each pixel in the pixel portion comprises a power supply line (one of V1 to Vx), a source signal line (one of S1 to Sx), a gate signal line (one of G1 to Gy), a switching TFT 9102, a driving TFT 9106, a capacitor storage 9107, an EL element 9105 and a testing capacitor 9108.

The switching TFT 9102 shown in FIG. 1 has a double gate structure. However, the switching TFT in each pixel of the display device according to the present invention is not limited to a double gate structure. It may take a single gate structure or a multi-gate structure having three or more gates.

The driving TFT 9106 shown in FIG. 1 has a single gate structure. However, the driving TFT in each pixel of the display device according to the present invention may take a double gate structure or a multi-gate structure.

A drain region of the driving TFT 9106 is connected not only to the EL element 9105 but also to the testing capacitor 9108. The testing capacitor 9108 is interposed between the drain region of the driving TFT 9106 and the gate signal line in this example. However, the structure of the present invention is not limited thereto and the testing capacitor may be placed between the drain region and another individual wiring.

Figure 2:
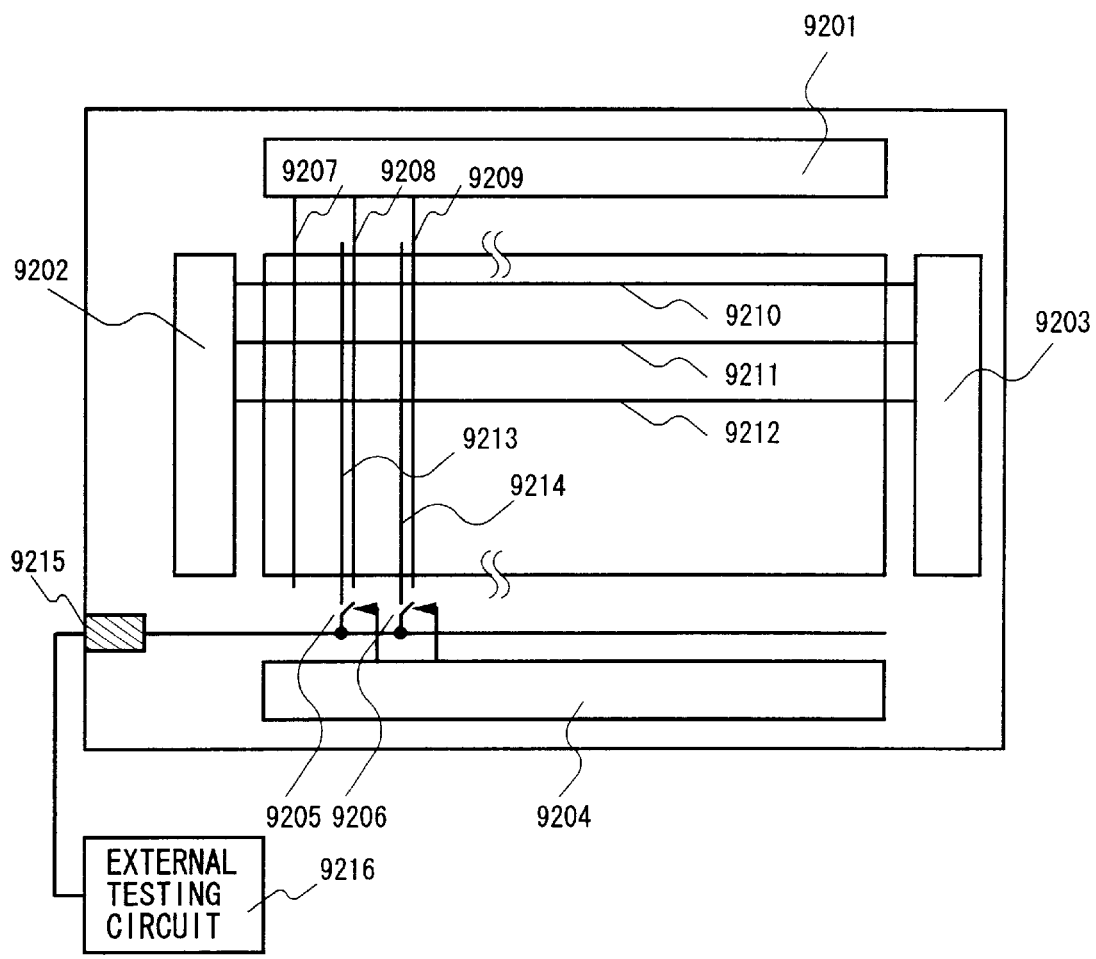
FIG. 2 is a block diagram of a display device according to the present invention.

FIG. 2 is a block diagram showing the display device of the present invention.

The display device comprises a source signal line driving circuit 9201, gate signal line driving circuits 9202 and 9203, a testing driver circuit 9204, switches 9205 and 9206, source signal lines 9207 to 9209, gate signal lines 9210 to 9212, pixel portion power supply lines 9213 and 9214, a power supply line lead out terminal 9215 and an external testing circuit 9216.

FIG. 2 shows some of the source signal lines, the gate signal lines, the power supply lines and the switches as representatives of the rest. The number of these lines actually provided corresponding to the number of pixels that constitute the display device.

Unlike the prior art, the testing driver circuit 9204 is added to the display device of the present invention. Also added are the switches 9205 and 9206 that are controlled by the testing driver circuit 9204 and interposed between the power supply line lead out terminal 9215 and the pixel portion power supply line 9213 and between the power supply line lead out terminal 9215 and the pixel portion power supply line 9214, respectively. The power supply line lead out terminal is connected to the external testing circuit 9216.

The testing driver circuit 9204 is arranged independently in FIG. 2. However, the source signal line driving circuit may also serve as the testing driver circuit if the signal line driving circuit is of analog type. (Not shown)

Next, a testing method used in the present invention will be described.

The description will be given with reference to FIGS. 1 and 2.

Assumed here is a test of a substrate in a stage after the TFT steps but before deposition of an EL material. The test may instead be conducted at other stages as long as wire connection has already been established between the TFTs, and between the capacitors (including the capacitor storage, the testing capacitor, etc.) and resistors or other components which constitute the display device.

Note that, although the EL element 9105 is found in FIG. 1, the EL element is not deposited and hence the EL element 9105 is not formed yet at the time of the test described below.

The first step is to apply a voltage corresponding to a signal "Hi", e.g. 10 V, to the power supply lines. Then successively running the driving circuits (the source signal line driving circuit 9201 and the gate signal line driving circuits 9202 and 9203), the driving TFT 9106 in each pixel is turned ON to write the 10 V voltage of the power supply lines V1 to Vx in each testing capacitor 9108. Capacitance of the testing capacitor is set from 0.05 pF to 1 pF.

The second step is as follows. The source signal line driving circuit 9201 and the gate signal line driving circuits 9202 and 9203 are operated to turn every driving TFT 9106 in the pixel portion OFF. Then the electric potential of the power supply lines V1 to Vx is set to a voltage corresponding to a signal "Lo", e.g., 0 V. The switches 9205 and 9206 at this point are remained ON.

The power supply lines V1 to Vx in the pixel portion thus come to have 0 V.

The third step includes the following operations.

Figure 3:
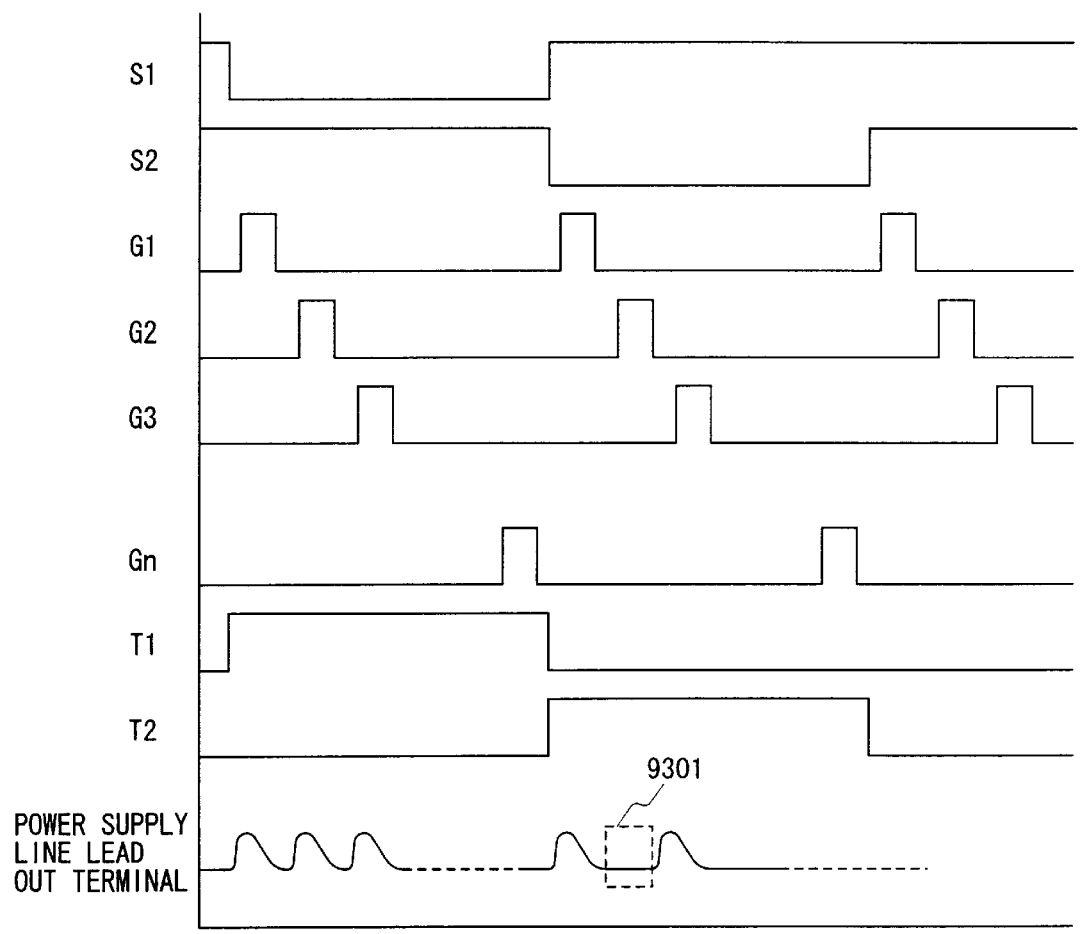
FIG. 3 is a timing chart illustrating a method of driving a display device according to the present invention.

The driving TFT 9106 in each pixel is put in motion in accordance with a timing illustrated in FIG. 3.

The timing chart of FIG. 3 shows the case where the switching TFT is an n-channel TFT and the driving TFT is a p-channel TFT. However, the switching TFT may either be an n-channel TFT or a p-channel TFT and the same applies to the driving TFT.

The source signal lines S1 to Sx are sequentially operated. In the illustration of FIG. 3, two source signal lines S1 and S2 represent the rest of the source signal lines and merely the operation for S1 and S2 will be described here. However, this operation is performed on all of the source signal lines S1 to Sx.

In a pixel whose source signal line has received input of a signal "Lo", the driving TFT 9107 is turned ON when a signal "Hi" is inputted to the gate signal lines G1 to Gy successively.

If all of the power supply lines V1 to Vx are connected, wiring capacitor is too large to detect the voltage. Therefore, in order to check the operation of the pixel TFTs, the switches to be connected to the power supply lines have to be arranged such that one switch is allocated to one column of pixels.

One column of pixels here is of pixels having switching TFTs connected to the same source signal line.

During the source signal line S1 is selected, a switch connected to the power supply line V1 for supplying power to pixels whose switching TFTs have source regions connected to the source signal line S1 is turned ON. Meanwhile, the switches connected to the power supply lines V2 to Vx that are associated with the other pixels are all turned OFF.

The source signal line S2 is selected next, during which a switch connected to the power supply line V2 for supplying power to pixels whose switching TFTs have source regions connected to the source signal line S2 is turned ON. Meanwhile, the switches connected to the power supply lines V1 and V3 to Vx that are associated with the other pixels are all turned OFF.

In FIG. 3, denoted by T1 and T2 are signals for turning ON or OFF the switch connected to the power supply line V1 and the switch connected to the power supply line V2, respectively.

In this embodiment, if T1 and T2 are signals "Hi" and inputted to power supply lines, the switches connected to those power supply lines are turned ON. On the other hand, the switches are turned OFF if T1 and T2 are signals "Lo".

When the driving TFT 9106 is turned ON in each pixel, electric charges held in the testing capacitor 9108 are discharged to the power supply lines V1 to Vx. The discharge gives a voltage to the power supply lines V1 to Vx.

This voltage is given as follows. The voltage generated is expressed as $V_{out}$ and is obtained from the equation 1:

$$V_{out}=10 \times C3/(C1+C2+C3)$$

where C1 is a wiring capacitance value of the power supply lines in the pixel portion, C2 is a capacitance up through the power supply line lead out terminal 9215, and C3 is a capacitance of the testing capacitor.

If C1=C2=10 pF and C3=0.1 pF, the voltage $V_{out}$ is 0.05 V.

The voltage $V_{out}$ is small and hence the detection thereof requires the external testing circuit 9216 connected to the power supply line lead out terminal 9215.

The voltage $V_{out}$ is not generated if the pixel TFT tested is defective because charge or discharge cannot be made successfully.

In the timing chart of FIG. 3, the voltage $V_{out}$ is generated in the power supply line lead out terminal 9215 every time a pixel is selected if the pixels are normal. If the pixel TFT is defective, it can be found out as a lack in voltage signal as indicated by 9301.

In this way, the pixel TFTs can be tested by selecting all pixels one by one.

Embodiments of the present invention will be descried below.

[Embodiment 1]

Embodiment 1 shows an example of the structure of a testing driver circuit in a display device of the present invention.

Figure 4:
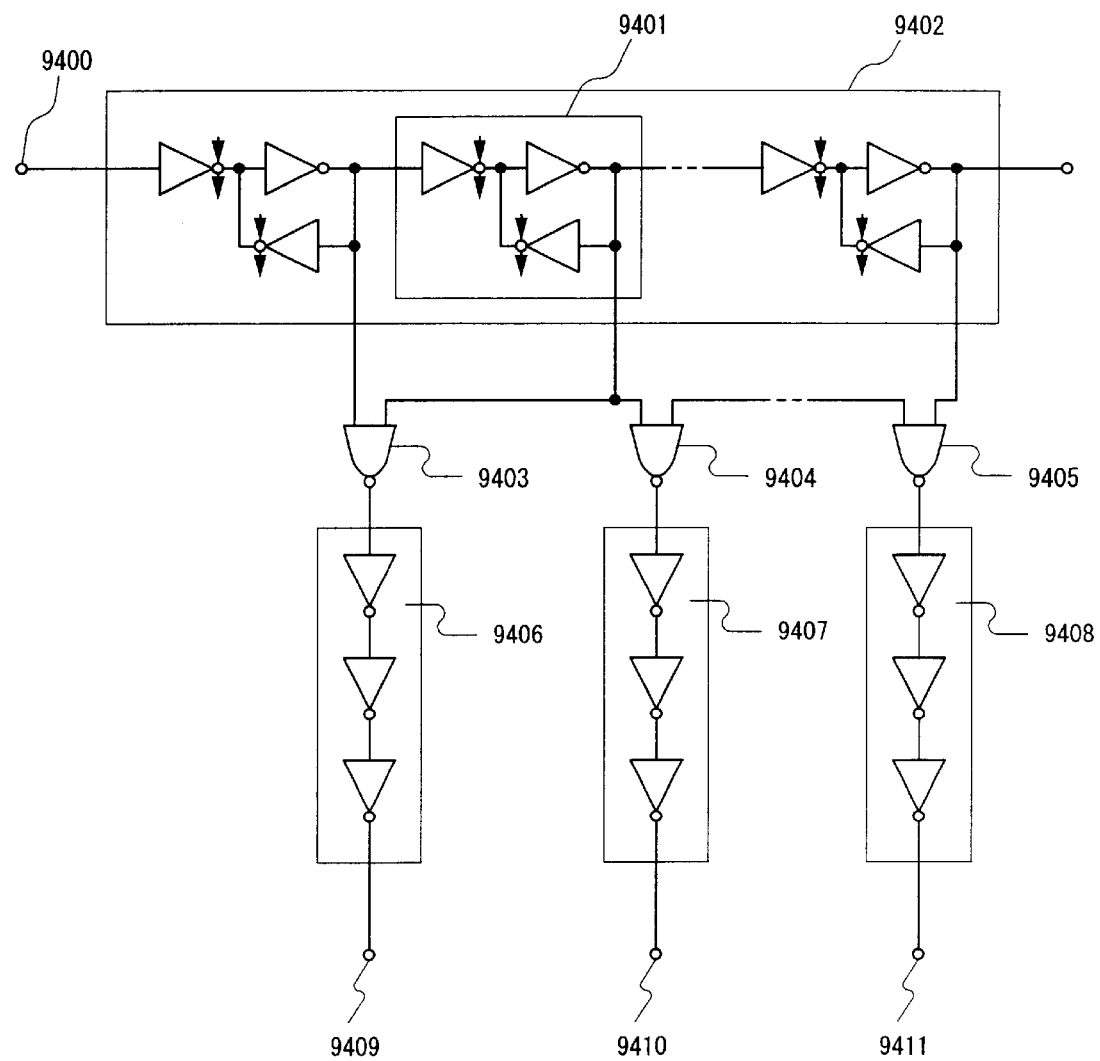
FIG. 4 is a diagram showing an embodiment of a testing driver circuit in a display device according to the present invention.

In FIG. 4, the testing driver circuit comprises a shift register 9402, NAND circuits 9403, 9404 and 9405, and buffer circuits 9406, 9407 and 9408. The shift register is comprised of a DFF 9401. The buffer circuits are comprised of inverters.

Although FIG. 4 shows merely a portion of the testing driver circuit which corresponds to three power supply lines, the actual testing driver circuit has all the circuits that correspond to all of the power supply lines.

The buffer circuits 9406, 9407 and 9408 have outputs 9409, 9410 and 9411, respectively. The outputs are connected to switches 9205, 9206, . . . shown in FIG. 2 and further connected to pixel portion power supply lines and a power supply line lead out terminal.

When a voltage "Hi" is inputted to an input terminal 9400 of the shift register 9402, the terminals 9409 to 9411 all outputs signals corresponding to "Hi", whereby all the switches are turned ON.

[Embodiment 2]

Embodiment 2 shows an example of the structure of an external testing circuit for a display device of the present invention.

Figure 5:
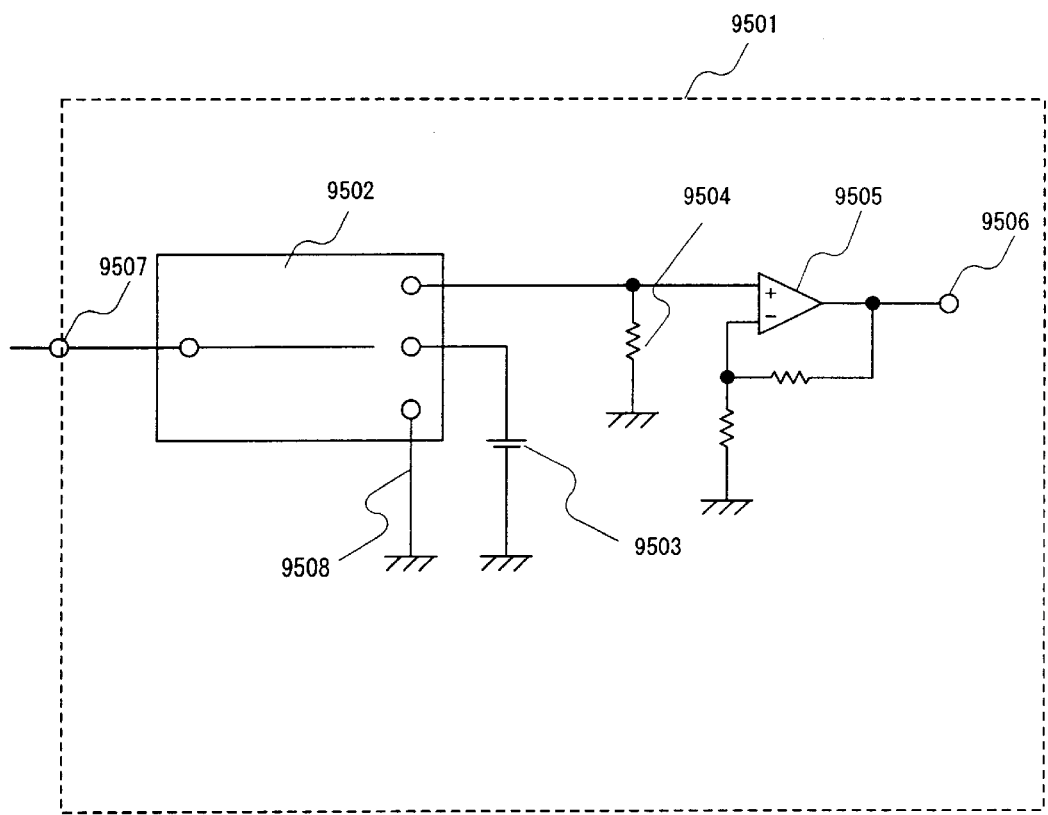
FIG. 5 is a diagram showing an embodiment of an external testing circuit for a display device according to the present invention.

In FIG. 5, an external testing circuit 9501 comprises a switch 9502 for switching connections, an amplifier 9505 for detecting a signal, a voltage source 9503, a resistor 9504, etc.

The switch 9502 selects one connection out of connections with three input terminals consisting of the voltage source 9503, a voltage source 9508 and the amplifier 9505. The voltage source 9503 is for a voltage corresponding to a signal "Hi", i.e., 10 V. The voltage source 9508 is for a voltage corresponding to a signal "Lo", i.e., 0 V. The amplifier 9505 amplifies a signal.

Note that the voltages of the voltage sources 9503 and 9508 are not limited to the values above but may be set to optimal values if necessary.

The power supply line lead out terminal of the substrate of the display device to be tested is connected to an input 9507, and the test is conducted following the steps described in Embodiment Mode 1. In the test, judgement is made by monitoring an output 9506 of the amplifier 9505.

The amplifier 9505 used here has a voltage gain of about 10 to 1000 folds, and amplifies a detection signal generated in the power supply line to sense the signal. A desirable gain of the amplifier is on the order of 100 folds.

This embodiment can be carried out in combination with Embodiment 1 without restriction.

[Embodiment 3]

A driving TFT 108 in the present invention may be an n-channel TFT or a p-channel TFT. However, if an anode of an EL element 110 serves as a pixel electrode and a cathode thereof serves as an opposite electrode, a p-channel TFT is preferably used for the driving TFT 108. On the other hand, when the anode of the EL element 110 serves as the opposite electrode and the cathode thereof serves as the pixel electrode, the driving TFT 108 is preferably an n-channel TFT.

This embodiment can be carried out in combination with Embodiment 1 or 2 without restriction.

[Embodiment 4]

Figure 6A:
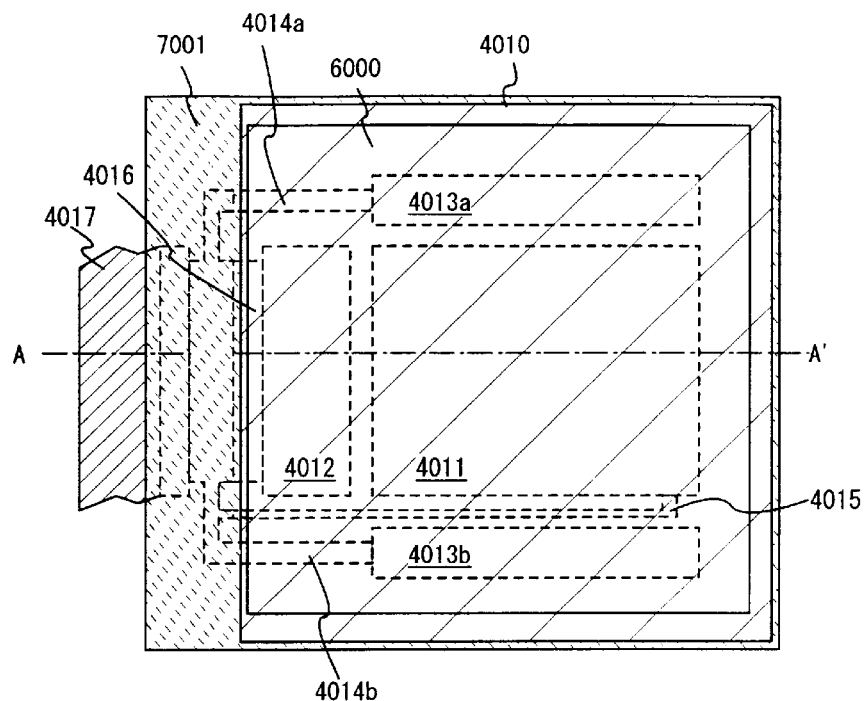
FIGS. 6A and 6B are a top view of a display device according to the present invention and a sectional view thereof, respectively.

Embodiment 4 shows an example of manufacturing an EL display device in accordance with the present invention. FIG. 6A is a top surface diagram of an EL display device using the present invention. In FIG. 6A, reference numeral 4010 denotes a substrate, 4011 denotes a pixel portion, 4012 denotes a source signal line driver circuit, and 4013*a* and 4013*b* denote gate signal line driver circuits. The respective driver circuits are connected to an external equipment via wirings 4014*a*, 4014*b*, 4015 and 4016 leading to an FPC 4017.

Note that in this embodiment, an example where the source signal line driver circuit 4012 functions as a testing driver circuit is described, however, the present invention is not limited to this structure. The testing driver circuit may be provided apart from the source signal line driver circuit.

A cover material 6000, a sealing material (also referred to as a housing material) 7000, an airtight material (a second sealing material) 7001 are provided at this time so as to surround at least the pixel portion, and preferably the driver circuit and the pixel portion.

Figure 6B:
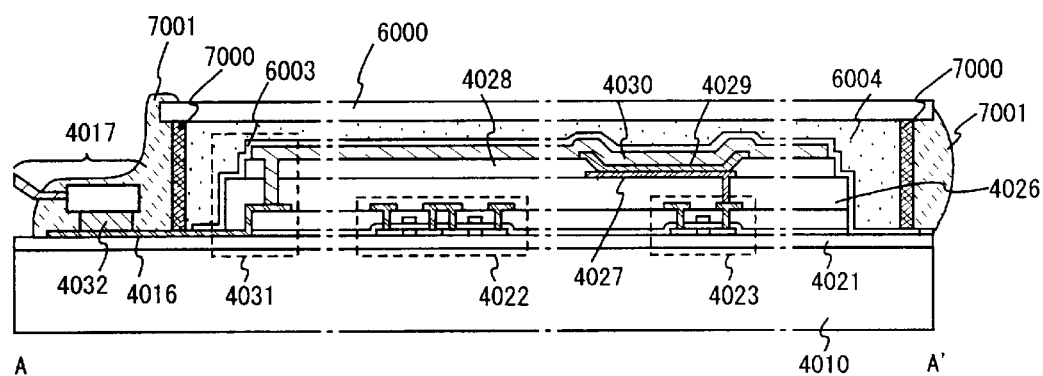

Further, FIG. 6B is a cross sectional structure of an EL display device of this embodiment, and a driver circuit TFT (note that a CMOS circuit in which an n-channel TFT and a p-channel TFT are combined is shown in the figures here) 4022 and a pixel portion TFT 4023 (note that only a driver TFT for controlling the electric current to the EL element is shown in the figures here) are formed on a base film 4021 on the substrate 4010. Known structures (top gate structures or bottom gate structures) may be used for these TFTs.

Note that a testing capacitor connected to a drain electrode of the driver TFT is not shown in FIG. 6B.

After completing the driver circuit TFT 4022 and the pixel portion TFT 4023 a pixel electrode 4027 made from a transparent conductive film for electrically connecting to a drain of the pixel portion TFT 4023 is formed on an interlayer insulating film (leveling film) 4026 made from a resin material. A compound of indium oxide and tin oxide (referred to as ITO) and a compound of indium oxide and zinc oxide can be used as the transparent conductive film. An insulating film 4028 is formed once the pixel electrode 4027 is formed, and an open portion is formed on the pixel electrode 4027.

Then, an EL layer 4029 is formed. A lamination structure of a known EL material (hole injecting layer, hole transporting layer, light emitting layer, electron transporting layer, and electron injecting layer), or a single layer structure, may be used for the EL layer 4029. The structure is formed using a known technique. Further, there are low molecular weight materials and high molecular weight materials (polymer materials) for the EL material. An evaporation method is used when a low molecular weight material is used, but it is possible to use a simple method such as spin coating, printing or ink-jet printing when a high molecular weight material is used.

The EL layer 4029 is formed by evaporation using a shadow mask in this embodiment. Color display becomes possible by forming light emitting layers (a red color light emitting layer, a green color light emitting layer, and a blue color light emitting layer) capable of emitting light at different wavelength for each pixel using the shadow mask. In addition, a method of combining a color changing layer (CCM) and a color filter, and a method of combining a white color light emitting layer and a color filter are available, and both may be used. Of course, a single color light emitting EL display device can also be made.

After forming the EL layer 4029, a cathode 4030 is formed on the EL layer. It is preferable to remove as much moisture and oxygen as possible from the interface between the cathode 4030 and the EL layer 4029. Therefore, a method in which the EL layer 4029 and the cathode 4030 are formed in succession within a vacuum, or in which the EL layer 4029 is formed in an inert atmosphere and the cathode 4030 is then formed without exposure to the atmosphere is necessary. In this embodiment, the above film formation can be performed by using a multi-chamber method (cluster tool method) film formation apparatus.

Note that a lamination structure of a LiF (lithium fluoride) film and an Al (aluminum) film is used as the cathode 4030 in this embodiment. Specifically, a 1 nm thick LiF (lithium fluoride) film is formed by evaporation on the EL layer 4029, and a 300 nm thick aluminum film is formed on the LiF film. An MgAg electrode, which is a known cathode material, may of course also be used. Then, the cathode 4030 is connected to the wiring 4016 in a region denoted by reference numeral 4031. The wiring 4016 is an electric power source supply line for applying a predetermined voltage to the cathode 4030, and is connected to the FPC 4017 through a conductive paste material 4032.

The cathode 4030 and the wiring 4016 are electrically connected in the region shown by reference numeral 4031, and therefore it is necessary to form contact holes in the interlayer insulating film 4026 and the insulating film 4028. These contact holes may be formed during etching of the interlayer insulating film 4026 (when the pixel electrode contact hole is formed) and during etching of the insulating film 4028 (when forming the open portion before forming the EL layer). Further, etching may also be performed together through to the interlayer insulating film 4026 when etching the insulating film 4028. A contact hole having a good shape can be formed in this case provided that the interlayer insulating film 4026 and the insulating film 4028 are formed by the same resin material.

A passivation film 6003, a filling material 6004, and the cover material 6000 are formed covering the surface of the EL element thus formed.

In addition, the sealing material 7000 is formed on the inside of the cover material 6000 and the substrate 4010 so as to surround the EL element portion. The airtight material (the second sealing material) 7001 is formed on the outside of the sealing material 7000.

The filling material 6004 functions as an adhesive for bonding the cover material 6000. PVC (polyvinyl chloride), epoxy resin, silicone resin, PVB (polyvinyl butyral) and EVA (ethylene vinyl acetate) can be used as the filling material 6004. A moisture absorption effect can be maintained if a drying agent is formed on the inside of the filling material 6004, and therefore it is preferable to do so.

Furthermore, spacers may be included within the filling material 6004. The spacers may be made from a powdered substance comprising a material such as BaO, giving the spacers themselves moisture absorbency.

In the case of providing the spacers, the passivation film 6003 can relieve the spacer pressure. Further, a film such as a resin film, separate from the passivation film 6003, may also be formed for relieving the spacer pressure.

Further, a glass plate, an aluminum plate, a stainless steel plate, an FRP (fiberglass-reinforced plastics) plate, a PVF (polyvinyl fluoride) film, a mylar film, a polyester film, and an acrylic film can be used as the cover material 6000. Note that when using PVB or EVA as the filling material 6004, it is preferable to use a sheet having a structure in which several 10 of $\mu$m of aluminum foil is sandwiched by a PVF film or a mylar film.

Note that, depending upon the direction of light emitted from the EL elements (light emission direction), it may be necessary for the cover material 6000 to have light transmitting characteristics.

Further, the wiring 4016 is electrically connected to the FPC 4017 through a gap between the sealing material 7000 and the airtight material 7001, and the substrate 4010. Note that, although the wiring 4016 is explained here, the other wirings 4014a, 4014b, and 4015 are also electrically connected to the FPC 4017 through a gap between the sealing material 7000 and the airtight material 7001, and the substrate 4010.

Note that the cover material 6000 is bonded after forming the filling material 6004 in Embodiment 5, and that the sealing material 7000 is attached so as to the side surface (exposed surface) of the filling material 6004, but the filling material 6004 may also be formed after attaching the cover material 6000 and the sealing material 7000. A filling material injection port passing through the gap formed by the substrate 4010, the cover material 6000 and the sealing material 7000 is formed in this case. The gap is then placed in a vacuum state (equal to or less than $10^{-2}$ Torr), and after immersing the injection port in a tank containing the filling material, the pressure on the outside of the gap is made higher than the pressure within the gap, and the filling material fills the space.

This embodiment can be carried out in combination with Embodiments 1 to 3 without restriction.

[Embodiment 5]

Embodiment 5 describes the structure of a source signal line driving circuit in the case of employing a digital time gray scale driving method instead of the analog gray scale driving method that has been described in the example of the prior art.

Figure 7:
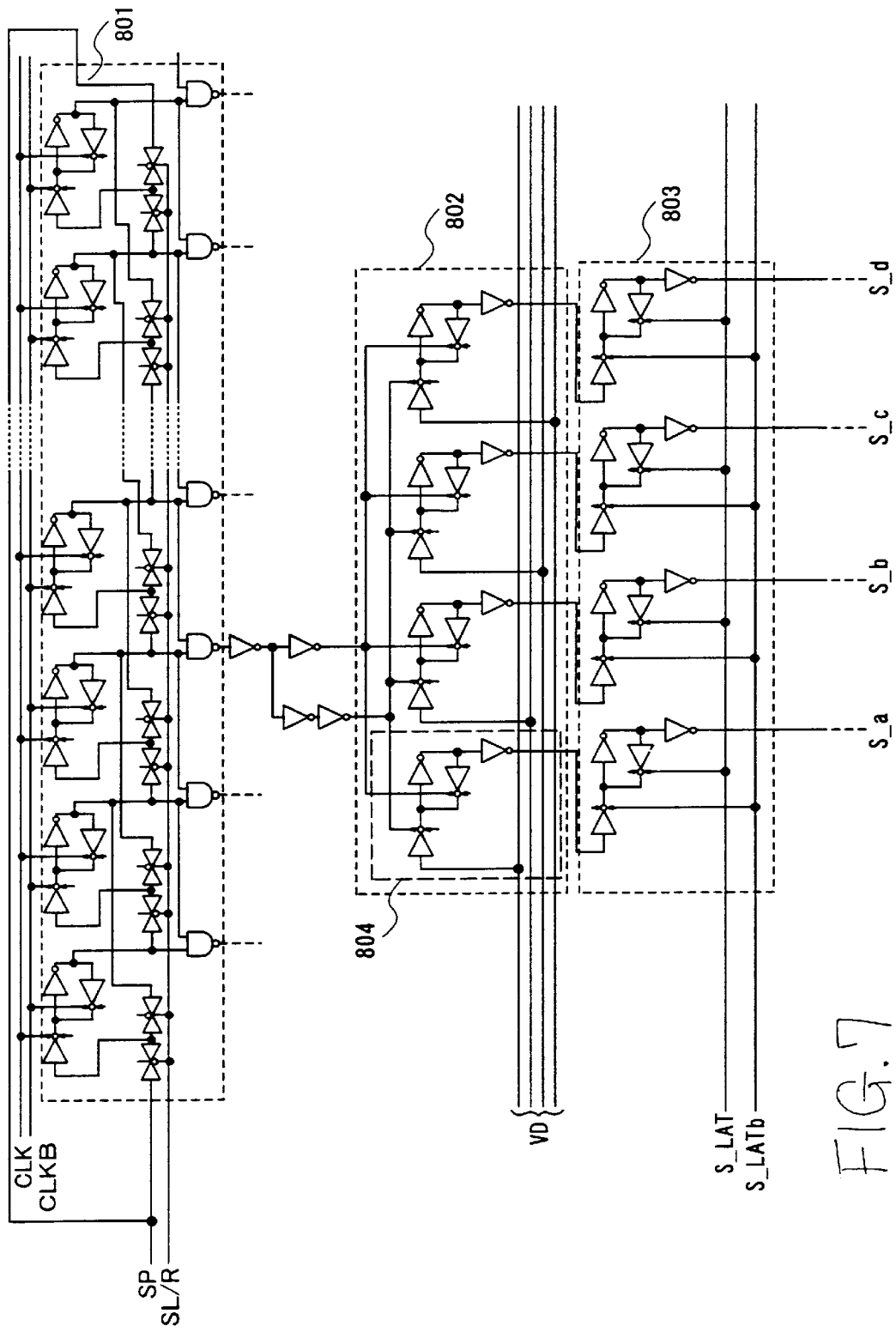
FIG. 7 is a circuit diagram showing a source signal line driving circuit of a display device according to the present invention.

FIG. 7 shows as a circuit diagram an example of the source signal line driving circuit used in this embodiment.

The present invention can adopt any one of the analog gray scale driving method, the digital time gray scale driving method and the digital area ratio gray scale driving method. The invention may also take a driving method that uses these gray scale methods in combination.

The source signal line driving circuit has a shift register 801, latches (A) 802 and latches (B) 803 which are arranged as shown in FIG. 7.

In this embodiment, a pair of latches (A) 802 and a pair of latches (B) 803 are associated with outputs to four source signal lines S_a to S_d. Therefore, four input lines VD are provided for digital image signals that are inputted from the external. The four input lines VD respectively receive signals to be inputted to the source signal lines S_a to S_d.

A level shifter for changing the amplitude of the voltage of the signal is not provided in this embodiment. However, the level shifter may be provided at discretion.

A clock signal CLK, an inverted clock signal CLKB obtained by inverting the polarity of the CLK, a start pulse signal SP, and a drive direction switching signal SL/R are inputted to the shift register 801 respectively from the wirings shown in FIG. 7. A digital data signal VD is inputted to the latches (A) 802 from the wirings shown in FIG. 7. A latch signal S_LAT and an inverted signal S_LATb obtained by inverting the polarity of the S_LAT are inputted to the latches (B) 803 respectively from the wirings shown in FIG. 7.

Details of the structure of the latches (A) 802 will be described taking as an example a portion 804 that is a part of the latches (A) 802 associated with the source signal line S_a. The portion 804 that is a part of the latches (A) 802 has two clocked inverters and two inverters.

Figure 8:
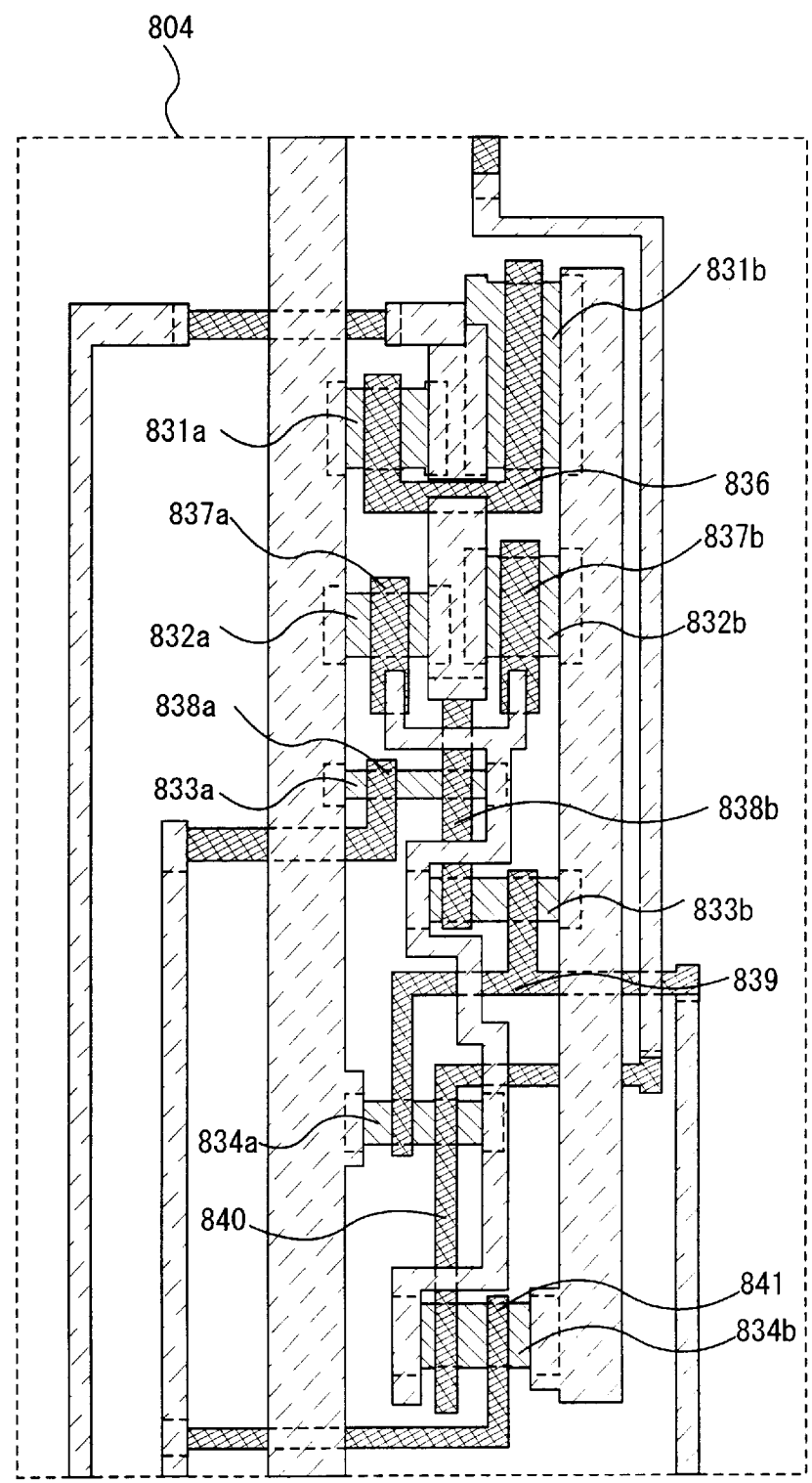
FIG. 8 is a top view of a latch of a display device according to the present invention.
Figure 10:
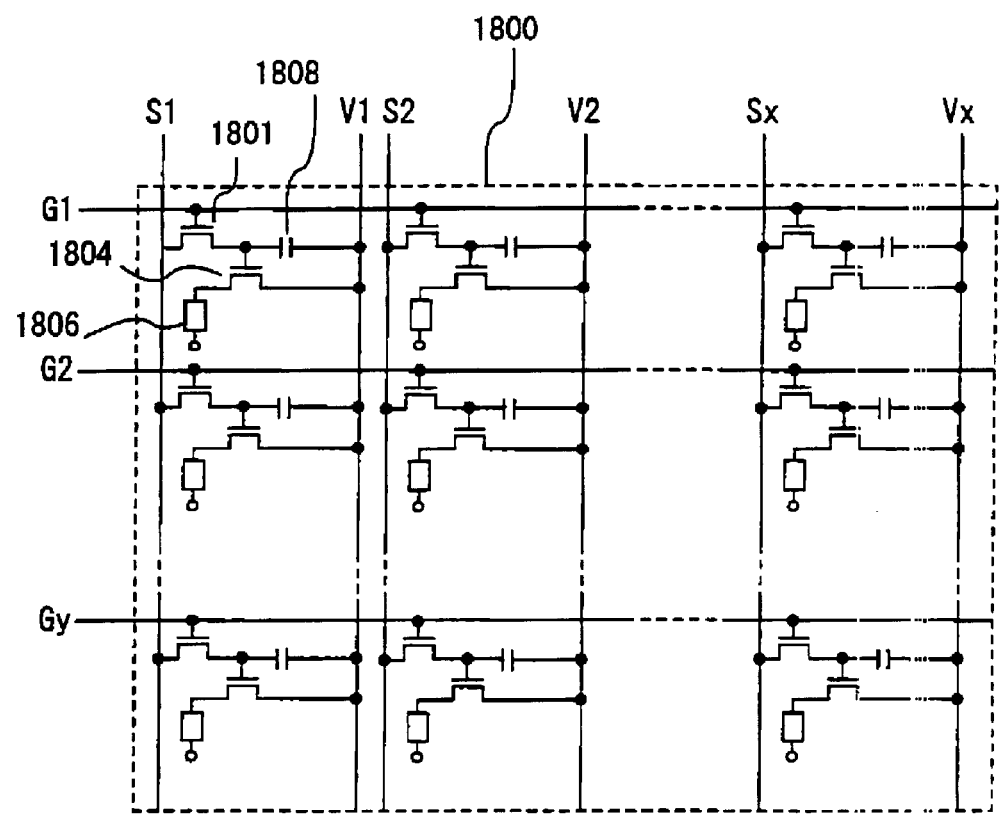
FIG. 10 is a circuit diagram of a pixel portion of a conventional display device.
Figure 11:
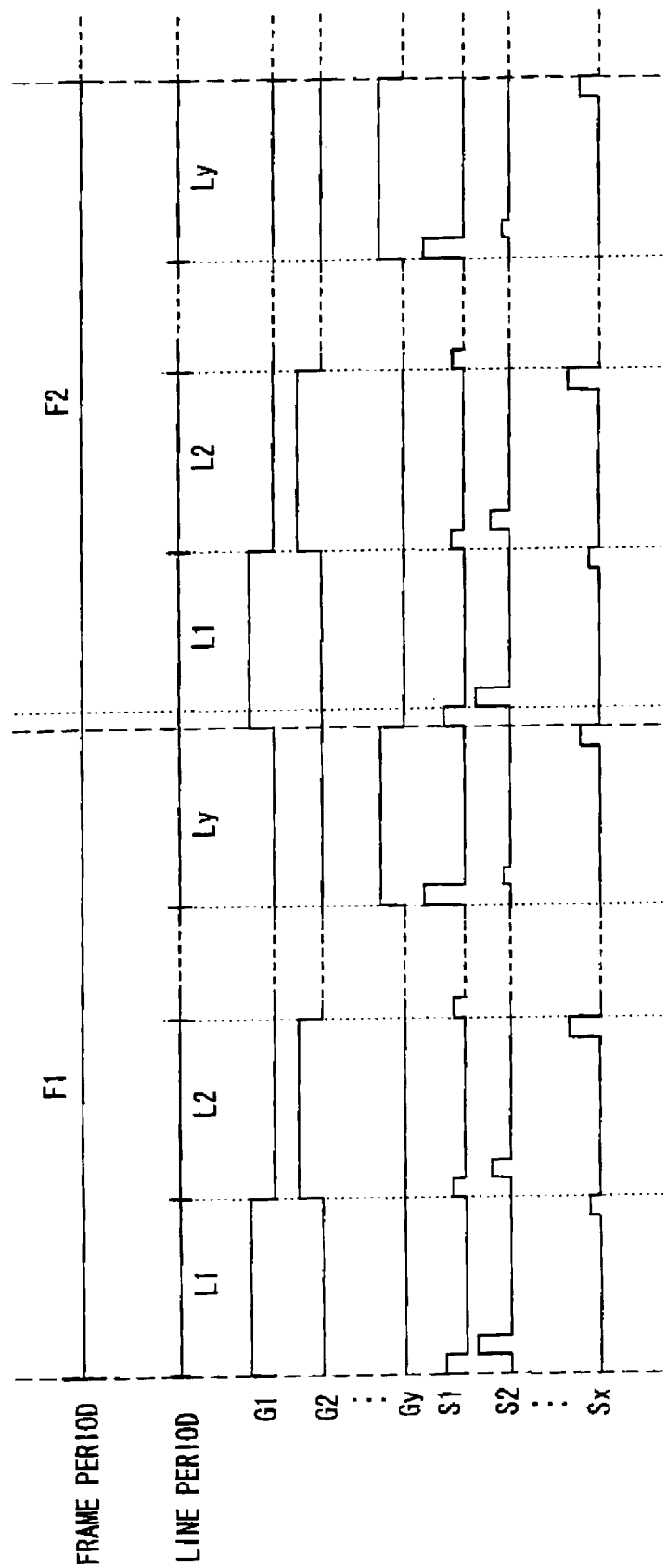
FIG. 11 is a timing chart illustrating an analog driving method for a display device.

FIG. 8 shows a top view of the portion 804 that is a part of the latches (A) 802. Denoted by 831a and 831b are active layers of TFTs that constitute one of the inverters of the portion 804 that is a part of the latches (A) 802. Reference symbol 836 denotes a common gate electrode of the TFTs constituting the one inverter. The other inverter of the portion 804 that is a part of the latches (A) 802 comprises TFTs whose active layers are denoted by 832a and 832b. On the active layers 832a and 832b, gate electrodes 837a and 837b are provided. The gate electrodes 837a and 837b are electrically connected to each other.

Denoted by 833a and 833b are active layers of TFTs that constitute one of the clocked inverters of the portion 804 that is a part of the latches (A) 802. On the active layer 833a, gate electrodes 838a and 838b are formed to provide a double gate structure. On the active layer 833b, the gate electrode 838b and a gate electrode 839 are formed to provide a double gate structure.

Denoted by 834a and 834b are active layers of TFTs that constitute the other clocked inverter of the portion 804 that is a part of the latches (A) 802. On the active layer 834a, the gate electrode 839 and a gate electrode 840 are formed to provide a double gate structure. On the active layer 834b, the gate electrode 840 and a gate electrode 841 are formed to provide a double gate structure.

This embodiment can be carried out in combination with any one of Embodiments 1 through 4 without restriction.

[Embodiment 6]

According to an EL display device of the present invention, a material used for an EL layer of an EL element is not limited to an organic EL material but may be an inorganic EL material. However, every inorganic EL material at present is very high in drive voltage and hence a TFT to be used has to have a withstand voltage characteristic that allows the TFT to withstand such a high drive voltage.

If an inorganic EL material of lower drive voltage is to be developed in future. it may also be used in the present invention.

This embodiment can be carried out in combination with any one of Embodiments 1 through 5 without restriction.

[Embodiment 7]

An electronic display formed by implementing the present invention, in particular, an EL display device is utilized for various electronic equipments. Electronic equipments incorporating an electronic display formed in accordance with this invention as a display medium will be explained as follows.

The following can be given as examples of such electronic equipments: a video camera; a television receiving machine; a digital camera; a head mounted display (a goggle type display); a game machine; a telephone; a car navigation system; a personal computer; an image reproducing device;

a portable information terminal (such as a mobile computer, a mobile telephone, or an electronic book). Examples of those electronic equipments are shown in FIG. 9.

FIG. 9A illustrates a personal computer, which includes a main body 2001, a frame 2002, a display portion 2003, a key board 2004, or the like. The EL display device of the present invention can be applied to the display portion 2003 of the personal computer.

FIG. 9B illustrates a video camera, which includes a main body 2101, a display portion 2102, an audio input portion 2103, operation switches 2104, a battery 2105, an image receiving portion 2106, or the like. The EL display device of the present invention can be applied to the display portion 2102 of the video camera.

FIG. 9C illustrates a portion (the right-half piece) of a head mounted display, which includes a main body 2301, signal cables 2302, a head mount band 2303, a display monitor 2304, an optical system 2305, a display portion 2306, or the like. The EL display device of the present invention can be applied to the display portion 2306 of the head mounted display.

FIG. 9D shows an image reproducing device provided with a recording medium (specifically, a DVD reproducing device). The image reproducing device comprises a main body 2401, a recording medium (CD, LD, DVD, or the like) 2402, operation switches 2403, a display portion (a) 2404, a display portion (b) 2405, etc. The display portion (a) mainly displays image information whereas the display portion (b) mainly displays character information. The EL display device of the present invention can be used for the display portions (a) and (b) of the image reproducing device provided with a recording medium. Note that the present invention also can be applied to other image reproducing machines provided with a recording medium, such as CD players and game machines.

FIG. 9E shows a portable (mobile) computer, which includes a main body 2501, a camera portion 2502, image receiving portion 2503, operation switches 2504, a display portion 2505, or the like. The EL display device of the present invention can be applied to the display portion 2505 of the portable (mobile) computer.

If the luminance of light emitted from EL materials is improved in future, the present invention can be used in front or rear type projectors.

The electronic equipments in this embodiment can be carried out in combination with any one of Embodiments 1 through 6 without restriction.

[Embodiment 8]

Figure 12:
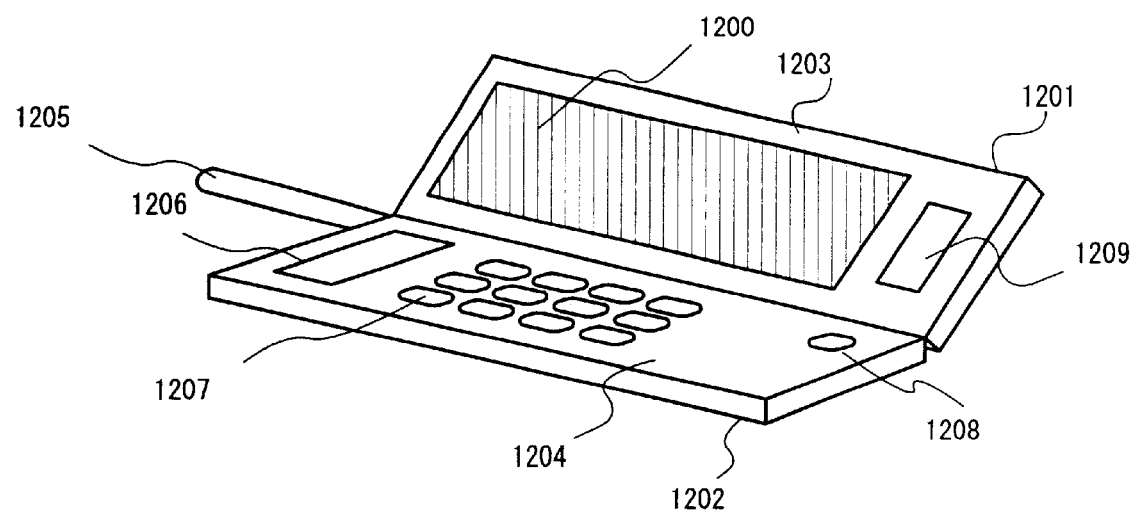
FIG. 12 is a diagram showing a cellular phone that employs the present invention.

FIG. 12 shows an example in which an EL display device is used in a cellular phone.

The cellular phone comprises a casing A 1201, a casing B 1202 and an antenna 1205. A display portion 1200 and a microphone 1209 are formed on a surface A 1203 of the casing A 1201. Formed on a surface B 1204 of the casing B 1204 are a speaker 1206, operation keys 1207, a power switch 1208, etc.

An EL display device of the present invention can be used as the display portion 1200 of the cellular phone.

The arrangement of the speaker 1206, the operation keys 1207, the display portion 1200, the microphone 1209 and the power switch 1208 is not limited to the one described above. The components can be formed on any part of the casing A 1201 and the casing B 1202. In FIG. 12, the cellular phone has two casing portions (the casing A 1201 and the casing B 1202) connected by a hinge (not shown) at one side. When the hinge is closed, the surface A 1203 of the casing A 1201 can be laid on top of the surface B 1204 of the casing B 1202. To lay the surface A 1203 of the casing A 1201 on top of the surface B 1204 of the casing B 1202 is referred to as folding the cellular phone in half.

Figure 13:
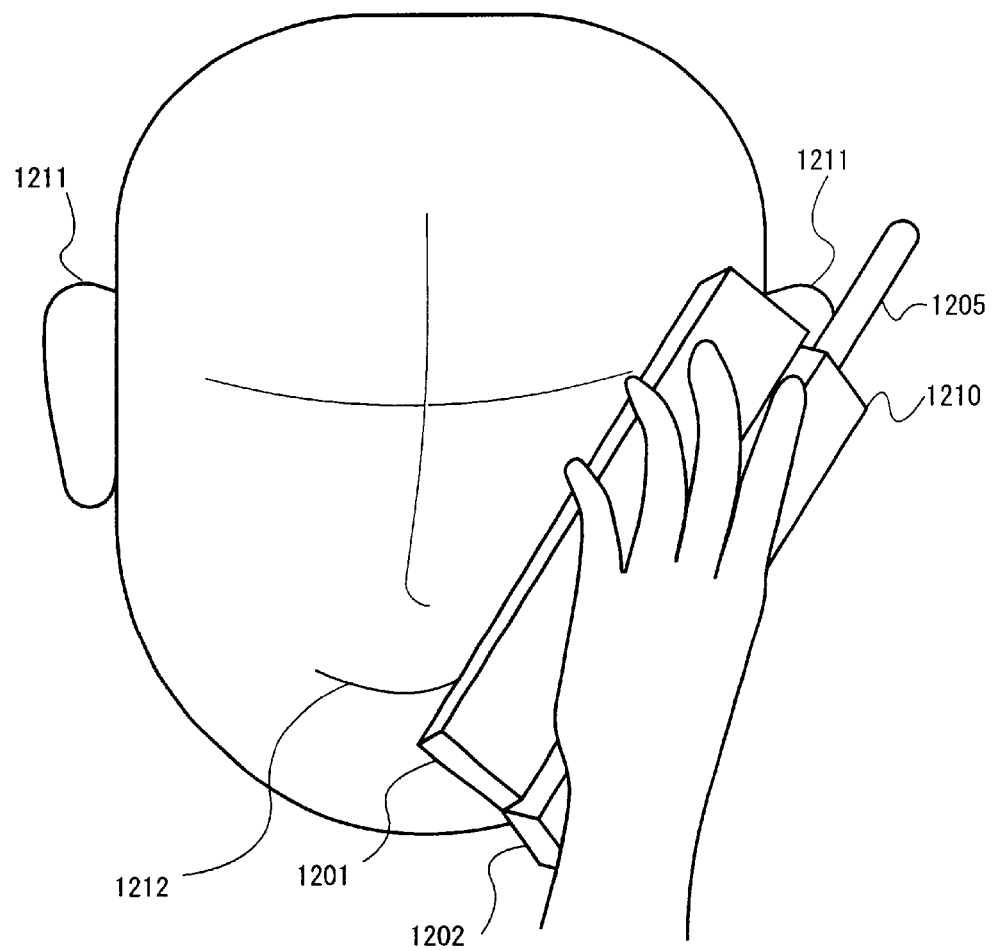
FIG. 13 is a diagram illustrating how to use the cellular phone that employs the present invention.

In this example, the cellular phone can be used in a way illustrated in FIG. 13. Since the speaker 1206 and the microphone 1209 are set in different casings, it is possible to place the speaker 1206 close to a ear 1211 and the microphone 1209 to a mouth 1212 with an adjustment of the angle between the surface A 1203 and the surface B 1204 on which they are set. This structure has an advantage of blocking the view of the mouth 1212 from the others while the user is speaking on the phone. Moreover, the microphone 1209 being in proximity to the mouth 1212 reduces the influence of noise and thereby improves the phone communication quality. Thus it is effective in reducing the number of noise filters in the cellular phone. With more operation keys 1207, the cellular phone can also serve as a portable information terminal.

As described above, the application range of the present invention is so wide that the invention can be applied to every field of electronic equipment. The electronic equipment of this embodiment can be obtained using any combination of structures of Embodiments 1 to 6.

With the structure above, a display device that allows its pixel TFTs to be tested before forming an EL layer can be provided. This makes it possible to remove the rejects before depositing an EL material, leading to a reduction in manufacturing cost.

What is claimed is:

1. An electro luminescence display device comprising:
   a plurality of source signal lines;
   a plurality of gate signal lines;
   a plurality of power supply lines;
   a plurality of switching thin film transistors;
   a plurality of driving thin film transistors;
   a plurality of storage capacitors; and
   a plurality of testing capacitors,
   wherein the source signal lines, the gate signal lines, the power supply lines, the switching thin film transistors, the driving thin film transistors and the storage capacitors are formed on an insulating substrate,
   wherein one of a source region and a drain region of one of said switching thin film transistors is connected to one of the source signal lines, the other of the source region and the drain region of said one of said switching thin film transistors is connected to one end of one of said storage capacitors, and the other end of said one of said storage capacitors is connected to one of said power supply lines,
   wherein one end of each of said testing capacitors is connected to a drain region of a corresponding one of the driving thin film transistors, the other end of said each testing capacitor is connected to one of the gate signal lines, and a source region of each of said driving thin film transistors is connected to one of said power supply lines, and
   wherein the power supply lines are led out of the insulating substrate through switches.

2. A device according to claim 1, wherein the switches are provided for the plural power supply lines on one on one basis, and
   wherein a driver circuit for driving the switches successively is placed on the insulating substrate.

3. A device according to claim 2, wherein the driver circuit for driving the switches successively has some components shared with a source signal line driving circuit.

4. A device according to claim 1, further comprising an external testing circuit connected the power supply lines through said switches.

5. A device according to claim 1, wherein capacitance of the testing capacitor is set from 0.05 pF to 1 pF.

6. A computer using an electro luminescence display device according to claim 1.

7. A video camera using an electro luminescence display device according to claim 1.

8. A head mount display using an electro luminescence display device according to claim 1.

9. An image reproducing device using an electro luminescence display device according to claim 1.

10. A portable information terminal using an electro luminescence display device according to claim 1.

11. An electro luminescence display device comprising:
a pixel region comprising:
a plurality of source signal lines;
a plurality of gate signal lines;
a plurality of power supply lines;
a plurality of switching thin film transistors;
a plurality of driving thin film transistors;
a plurality of electro luminescence elements,
a plurality of storage capacitors; and
a plurality of testing capacitors; and
driver circuits comprising at least a gate signal line driver circuit, a source signal line driver circuit, and a testing driver circuit which are all formed over said substrate,
wherein the source signal lines, the gate signal lines, the power supply lines, the switching thin film transistors, the driving thin film transistors, the electro luminescence elements and the storage capacitors are formed on an insulating substrate,
wherein one of a source region and a drain region of one of said switching thin film transistors is connected to one of the source signal lines, the other of the source region and the drain region of said one of said switching thin film transistors is connected to one end of one of said storage capacitors, and the other end of said one of said storage capacitors is connected to one of said power supply lines,
wherein one end of each of said testing capacitors is connected to a drain region of one of the driving thin film transistors, the other end of said each testing capacitor is connected to one of the gate signal lines, and a source region of each of said driving thin film transistors is connected to one of said power supply lines, and
wherein the power supply lines are connected to said testing driver circuit through switches.

12. A device according to claim 11, further comprising an external testing circuit connected the power supply lines through said switches.

13. A device according to claim 11, wherein capacitance of the testing capacitor is set from 0.05 pF to 1 pF.

14. A computer using an electro luminescence display device according to claim 11.

15. A video camera using an electro luminescence display device according to claim 11.

16. A head mount display using an electro luminescence display device according to claim 11.

17. An image reproducing device using an electro luminescence display device according to claim 11.

18. A portable information terminal using an electro luminescence display device according to claim 11.

19. A method of testing an electro luminescence display device comprising the steps of:
applying a voltage to the power supply lines;
operating a driving thin film transistor to charge a testing capacitor until it reaches and keeps a certain level of electric potential;
turning the driving thin film transistor OFF and then setting the electric potential of the power supply lines to a level different from the electric potential of the testing capacitor;
turning the driving thin film transistor ON;
leading the electric charges charged in the testing capacitor out for each pixel through its associated power supply line; and
detecting a change in the electric potential using a testing circuit connected to the power supply line lead out terminal.

20. A method of testing an electro luminescence display device comprising the steps of:
applying a voltage corresponding to a signal "Hi" to the power supply lines;
turning a driving thin film transistor in each pixel ON to write the voltage of the power supply lines in each testing capacitor;
turning said driving thin film transistor OFF so that an electric potential of the power supply lines is set to a voltage corresponding to a signal "Lo"; and then
turning said driving thin film transistor ON, thereby electric charges held in the testing capacitor are discharged to the power supply lines; and
detecting the discharged voltage using a testing circuit connected to the power supply line lead out terminal.

* * * * *